(12) United States Patent
Kim et al.

(10) Patent No.: US 11,437,407 B2
(45) Date of Patent: Sep. 6, 2022

(54) DISPLAY APPARATUS HAVING AN OXIDE SEMICONDUCTOR PATTERN (71) Applicant: LG Display Co., Ltd., Seoul (KR)

(72) Inventors: Ki-Tae Kim, Seoul (KR); So-Young Noh, Goyang-si (KR); Ui-Jin Chung, Goyang-si (KR); Kyeong-Ju Moon, Paju-si (KR); Hyuk Ji, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/119,184

(22) Filed: Dec. 11, 2020

(65) Prior Publication Data

US 2021/0202566 A1 Jul. 1, 2021

(30) Foreign Application Priority Data

Dec. 31, 2019 (KR) ........................ 10-2019-0180183

(51) Int. Cl.
H01L 27/12 (2006.01)
H01L 27/15 (2006.01)
H01L 33/62 (2010.01)
H01L 29/786 (2006.01)
H01L 33/54 (2010.01)

(52) U.S. Cl.
CPC ........ H01L 27/1214 (2013.01); H01L 27/156 (2013.01); H01L 29/7869 (2013.01); H01L 29/78606 (2013.01); H01L 29/78696 (2013.01); H01L 33/54 (2013.01); H01L 33/62 (2013.01)

(58) Field of Classification Search
CPC ..... H01L 21/823412; H01L 21/823437; H01L 27/1214; H01L 27/1225; H01L 27/146; H01L 27/14683; H01L 27/156; H01L 27/3244; H01L 27/326; H01L 27/3262; H01L 29/66; H01L 29/772; H01L 29/78; H01L 29/786; H01L 29/78606; H01L 29/7869; H01L 29/78696; H01L 33/0041; H01L 33/36; H01L 33/40; H01L 33/48; H01L 33/52; H01L 33/54; H01L 33/62;
(Continued)

(56) References Cited

U.S. PATENT DOCUMENTS 8,803,149 B2 8/2014 Sakata
2011/0001146 A1* 1/2011 Yamazaki ............... H01L 33/48
257/79
(Continued)

FOREIGN PATENT DOCUMENTS

CN 104867982 B 8/2018

Primary Examiner — Cheung Lee
(74) Attorney, Agent, or Firm — Birch, Stewart, Kolasch & Birch, LLP (57) ABSTRACT A display apparatus in which a thin film transistor includes an oxide semiconductor pattern is disclosed. A gate electrode of the thin film transistor can overlap a channel region of the oxide semiconductor pattern. The gate electrode can have a structure in which a hydrogen barrier layer and a low-resistance electrode layer are stacked. A light-emitting device and an encapsulating element can be sequentially stacked on the thin film transistor. A thickness of the hydrogen barrier layer can be determined by a content of hydrogen per unit area of the encapsulating element. Thus, in the display apparatus, the characteristics deterioration of the thin film transistor due to hydrogen diffused from the encapsulating element can be prevented.

17 Claims, 8 Drawing Sheets

(58) Field of Classification Search
CPC ........... G02F 1/134309; G02F 2201/50; G02F 2201/501
See application file for complete search history.

(56) References Cited

U.S. PATENT DOCUMENTS

2014/0042428 A1* 2/2014 Ning ................. H01L 29/78606
    257/43
2018/0006142 A1* 1/2018 Yan ................... H01L 29/41733

* cited by examiner

DISPLAY APPARATUS HAVING AN OXIDE SEMICONDUCTOR PATTERN

CROSS-REFERENCE TO RELATED APPLICATIONS

This application claims the priority benefit of Korean Patent Application No. 10-2019-0180183, filed in the Republic of Korea on Dec. 31, 2019, the entire contents of which are hereby expressly incorporated by reference into the present application.

BACKGROUND OF THE INVENTION

Field of the Invention

The present disclosure relates to a display apparatus in which a thin-film transistor includes an oxide semiconductor pattern.

Discussion of the Related Art

In general, an electronic appliance such as a monitor, a TV, a laptop computer, and a digital camera includes a display apparatus to realize an image. For example, the display apparatus can include a light-emitting device. The light-emitting device can emit light displaying a specific color. For example, the light-emitting device can include a light-emitting layer between a first electrode and a second electrode.

The display apparatus can include a driving circuit electrically connected to the light-emitting device, and an encapsulating element covering the driving circuit and the light-emitting device. The driving circuit can provide a driving current corresponding to a data signal to the light-emitting device according to a gate signal. For example, the driving circuit can include at least one thin-film transistor. The encapsulating element can prevent damage of the light-emitting device due to an external impact and moisture. For example, the encapsulating element can have a structure in which an inorganic insulating layer and an organic insulating layer are stacked.

The thin-film transistor can include an oxide semiconductor in order to prevent defects due to leakage current. However, in the display apparatus, a channel region of the oxide semiconductor pattern can be deteriorated by hydrogen which is diffused from the encapsulating element. Thus, in the display apparatus, the characteristics of the thin-film transistor can be deteriorated by the encapsulating element.

SUMMARY OF THE INVENTION

Accordingly, the embodiments of the present invention are directed to a display apparatus that substantially obviates one or more problems due to limitations and disadvantages of the related art.

An object of the present disclosure is to provide a display apparatus capable of preventing or minimizing the characteristics deterioration of the thin film transistor due to the encapsulating element.

Another object of the present disclosure is to provide a display apparatus capable of preventing or minimizing the deterioration of the channel region of the oxide semiconductor pattern due to hydrogen diffused from the encapsulating element.

Additional advantages, objects, and features of the invention will be set forth in part in the description which follows and in part will become apparent to those having ordinary skill in the art upon examination of the following or can be learned from practice of the invention. The objectives and other advantages of the invention can be realized and attained by the structure particularly pointed out in the written description and claims hereof as well as the appended drawings.

To achieve these objects and other advantages and in accordance with the purpose of the invention, as embodied and broadly described herein, there is provided a display apparatus comprising a device substrate. A driving circuit and a light-emitting device are disposed on the device substrate. The driving circuit includes a thin film transistor. The thin film transistor includes an oxide semiconductor pattern, a first hydrogen barrier layer and a low-resistance electrode layer. The first hydrogen barrier layer and the low-resistance electrode layer are stacked on a channel region of the oxide semiconductor pattern. The light-emitting device is electrically connected to the driving circuit. An encapsulating element is disposed on the driving circuit and the light-emitting device. A thickness of the first hydrogen barrier layer is determined by the following equation:

$$y \geq 2.15 \times 10^{-16} x - 159.76 \qquad \text{[equation]}$$

In the above equation, x is a content of hydrogen per unit area of the encapsulating element, y is the thickness of the first hydrogen barrier layer, and a thickness unit of the first hydrogen barrier layer is Å.

The first hydrogen barrier layer can include titanium (Ti).

The first hydrogen barrier layer can be disposed between the oxide semiconductor pattern and the low-resistance electrode layer.

A gate insulating layer can be disposed between the oxide semiconductor pattern and the first hydrogen barrier layer. The first hydrogen barrier layer can be in contact with the gate insulating layer.

A second hydrogen barrier layer can be disposed on the low-resistance electrode layer.

A thickness of the second hydrogen barrier layer can be different from the thickness of the first hydrogen barrier layer.

The low-resistance electrode layer can have a material having a lower resistance than the first hydrogen barrier layer.

In another embodiment, the display apparatus includes a device substrate. An oxide semiconductor pattern, a gate electrode, a gate insulating layer, a source electrode, a drain electrode and an encapsulating element are disposed on the device substrate. The oxide semiconductor pattern includes a channel region between a source region and a drain region. The gate electrode is disposed on the channel region of the oxide semiconductor pattern. The gate electrode has a structure in which a first hydrogen barrier layer and a low-resistance electrode layer are stacked. The gate insulating layer is disposed between the oxide semiconductor pattern and the gate electrode. The source electrode is electrically connected to the source region of the oxide semiconductor pattern. The drain electrode is electrically connected to the drain region of the oxide semiconductor pattern. The encapsulating element covers the oxide semiconductor pattern, the gate electrode, the gate insulating layer, the source electrode and the drain electrode. A thickness of the first hydrogen barrier layer and a content of hydrogen per unit area of the encapsulating element satisfy the following equation:

$$y \geq 2.15 \times 10^{-16} x - 159.76 \qquad \text{[equation]}$$

In the above equation, x is the content of hydrogen per unit area of the encapsulating element, y is the thickness of the first hydrogen barrier layer, and a thickness unit of the first hydrogen barrier layer is Å.

The thickness of the first hydrogen barrier layer can be 125 Å or more.

The low-resistance electrode layer can be disposed between the gate insulating layer and the first hydrogen barrier layer.

The first hydrogen barrier layer can extend onto a side surface of the low-resistance electrode layer.

The gate electrode can include a second hydrogen barrier layer between the gate insulating layer and the low-resistance electrode layer.

The first hydrogen barrier layer can extend onto a side surface of the second hydrogen barrier layer.

The encapsulating element can have a structure in which an inorganic insulating layer and an organic insulating layer are stacked. The thickness of the first hydrogen barrier layer can be proportional to a content of hydrogen per unit area of the inorganic insulating layer.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE EMBODIMENTS

Hereinafter, details related to the above objects, technical configurations, and operational effects of the embodiments of the present invention will be clearly understood by the following detailed description with reference to the drawings, which illustrate some embodiments of the present invention. Here, the embodiments of the present invention are provided in order to allow the technical sprit of the present invention to be satisfactorily transferred to those skilled in the art, and thus the present invention can be embodied in other forms and is not limited to the embodiments described below.

In addition, the same or extremely similar elements can be designated by the same reference numerals throughout the specification, and in the drawings, the lengths and thickness of layers and regions can be exaggerated for convenience. It will be understood that, when a first element is referred to as being "on" a second element, although the first element can be disposed on the second element so as to come into contact with the second element, a third element can be interposed between the first element and the second element.

Here, terms such as, for example, "first" and "second" can be used to distinguish any one element with another element and may not define any order. However, the first element and the second element can be arbitrary named according to the convenience of those skilled in the art without departing the technical sprit of the present invention.

The terms used in the specification of the present invention are merely used in order to describe particular embodiments, and are not intended to limit the scope of the present invention. For example, an element described in the singular form is intended to include a plurality of elements unless the context clearly indicates otherwise. In addition, in the specification of the present invention, it will be further understood that the terms "comprises" and "includes" specify the presence of stated features, integers, steps, operations, elements, components, and/or combinations thereof, but do not preclude the presence or addition of one or more other features, integers, steps, operations, elements, components, and/or combinations.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 1:
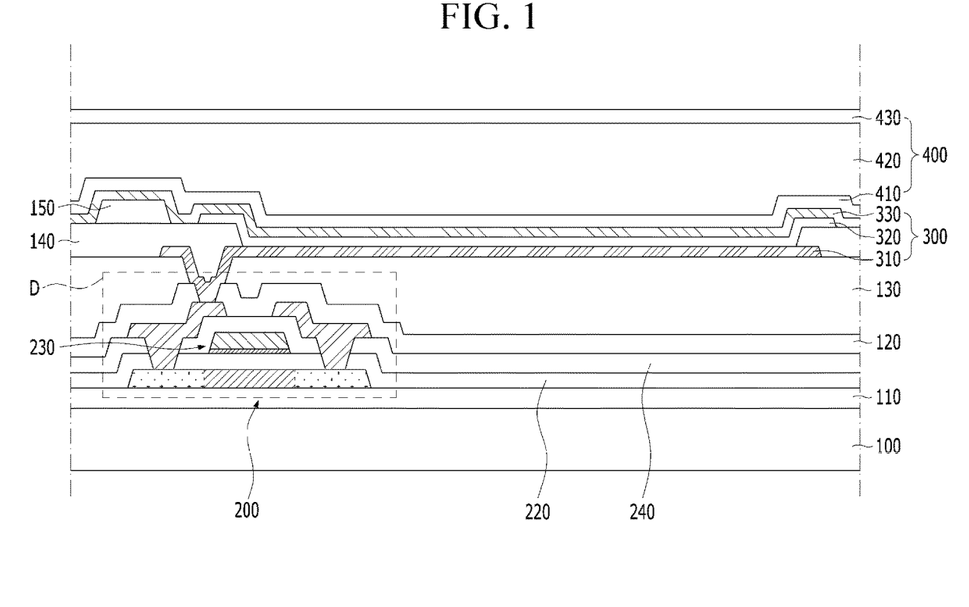
FIG. 1 is a view schematically showing a display apparatus according to an embodiment of the present invention.
Figure 2:
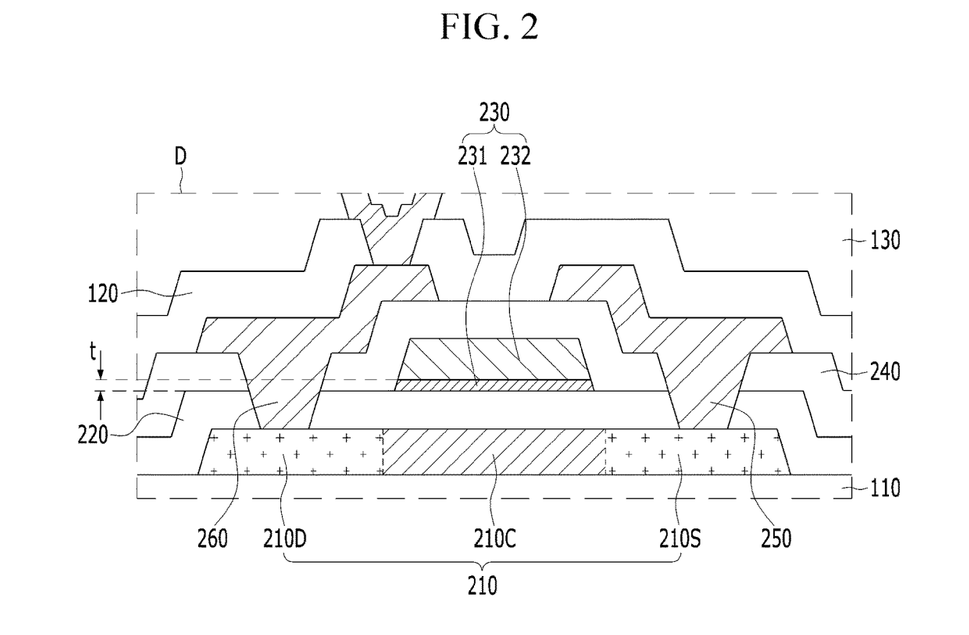
FIG. 2 is an enlarged view of a driving circuit in FIG. 1.

FIG. 1 is a view schematically showing a display apparatus according to an embodiment of the present invention. FIG. 2 is an enlarged view of a driving circuit in FIG. 1. All the components of the display apparatus according to all embodiments of the present invention are operatively coupled and configured.

Referring to FIGS. 1 and 2, the display apparatus according to the embodiment of the present invention can include a device substrate 100. A driving circuit D, a light-emitting device 300 and an encapsulating element 400 can be disposed on the device substrate 100. For example, the device substrate 100 can support the driving circuit D, the light-emitting device 300 and the encapsulating element 400. The device substrate 100 can include an insulating material. For example, the device substrate 100 can include glass or plastic.

The light-emitting device 300 can be electrically connected to the driving circuit D. The driving circuit D can apply a driving current corresponding to a data signal to the light-emitting device 300 according to a scan signal. For example, the driving circuit D can include a thin film transistor 200.

The thin film transistor 200 can include an oxide semiconductor pattern 210, a gate insulating layer 220, a gate electrode 230, an interlayer insulating layer 240, a source electrode 250 and a drain electrode 260. The oxide semiconductor pattern 210 can be an oxide semiconductor. For example, the oxide semiconductor pattern can include a metal oxide, such as IGZO. Thus, in the display apparatus according to the embodiment of the present invention, the defects of the thin film transistor due to leakage current can be prevented.

The oxide semiconductor pattern 210 can include a source region 210S, a channel region 210C and a drain region 210D. The channel region 210C can be disposed between the source region 210S and the drain region 210D. The source region 210S and the drain region 210D can have higher electrical conductivity than the channel region 210C. A resistance of the source region 210S and a resistance of the drain region 210D can be lower than a resistance of the channel region 210C. For example, the source region 210S and the drain region 210D can be a conductorized region.

The gate insulating layer 220 can be disposed on the oxide semiconductor pattern 210. The gate insulating layer 220 can extend beyond the oxide semiconductor pattern 210. For example, a side surface of the oxide semiconductor pattern 210 can be covered by the gate insulating layer 220. The gate insulating layer 220 can include an insulating material. For example, the gate insulating layer 220 can include silicon oxide (SiO). The gate insulating layer 220 can include a material having a high dielectric constant. For example, the gate insulating layer 122 can include a High-K material, such as hafnium oxide (HfO). The gate insulating layer 220 can have a multi-layer structure.

The gate electrode 230 can be disposed on the gate insulating layer 220. The gate electrode 230 can overlap the channel region 210C of the oxide semiconductor pattern 210. For example, the gate electrode 230 can be insulated from the oxide semiconductor pattern 210 by the gate insulating layer 220. The channel region 210C of the oxide semiconductor pattern 210 can have an electrical conductivity depending on a voltage applied to the gate electrode 210. For example, the channel region 210C of the oxide semiconductor pattern 210 can be a semiconductor region.

The gate electrode 230 can have a multi-layer structure. For example, the gate electrode 230 can have a structure in which a hydrogen barrier layer 231 and a low-resistance electrode layer 232 are sequentially stacked. The hydrogen barrier layer 231 can be formed simultaneously with the low-resistance electrode layer 232. For example, a side surface of the hydrogen barrier layer 231 can be vertically aligned with a side surface of the low-resistance electrode layer 232.

The hydrogen barrier layer 231 can be disposed close to the oxide semiconductor pattern 210. For example, the hydrogen barrier layer 231 can be disposed between the oxide semiconductor pattern 210 and the low-resistance electrode layer 232. The hydrogen barrier layer 231 can be in direct contact with the gate insulating layer 220. The hydrogen barrier layer 231 can include a hydrogen absorbing material. The hydrogen barrier layer 231 can include a conductive material. For example, the hydrogen barrier layer 231 can include titanium (Ti).

The low-resistance electrode layer 232 can be disposed on the hydrogen barrier layer 231. For example, the low-resistance electrode layer 232 can be in direct contact with the hydrogen barrier layer 231. The low-resistance electrode layer 232 can include a conductive material. The low-resistance electrode layer 232 can include a material different from the hydrogen barrier layer 231. An electrical conductivity of the low-resistance electrode layer 232 can be higher than an electrical conductivity of the hydrogen barrier layer 231. The low-resistance electrode layer 232 can have a lower resistance than the hydrogen barrier layer 231. For example, the low-resistance electrode layer 232 can include a metal, such as aluminum (Al), chromium (Cr), molybdenum (Mo), tungsten (W) and copper (Cu).

A thickness of the low-resistance electrode layer 232 can be larger than a thickness of the hydrogen barrier layer 231. Thus, in the display apparatus according to the embodiment of the present invention, the delay of the signal applied through the gate electrode 230 due to the hydrogen barrier layer 231 can be prevented. For example, in the display apparatus according to the embodiment of the present invention, the degree of freedom for the material of the hydrogen barrier layer 231 can be improved.

The interlayer insulating layer 240 can be disposed on the gate electrode 230. The interlayer insulating layer 240 can extend beyond the gate electrode 230. For example, a side surface of the gate electrode 230 can be covered by the interlayer insulating layer 240. The interlayer insulating layer 240 can extend beyond the oxide semiconductor pattern 210. The interlayer insulating layer 240 can include an insulating material. For example, the interlayer insulating layer 240 can include silicon oxide (SiO).

The source electrode 250 can be electrically connected to the source region 210S of the oxide semiconductor pattern 210. The source electrode 250 can be insulated from the gate electrode 230. For example, the source electrode 250 can be disposed on the interlayer insulating layer 240. The source electrode 250 can include a portion overlapping with the source region 210S. For example, the gate insulating layer 220 and the interlayer insulating layer 240 can include a source contact hole partially exposing the source region 210S. The source electrode 250 can be in direct contact with the source region 210S in the source contact hole. The source electrode 250 can include a conductive material. For example, the source electrode 250 can include a metal, such as aluminum (Al), chromium (Cr), molybdenum (Mo), tungsten (W) and copper (Cu). The source electrode 250 can include a material different from the low-resistance electrode layer 232.

The drain electrode 260 can be electrically connected to the drain region 210D of the oxide semiconductor pattern 210. The drain electrode 260 can be insulated from the gate electrode 230. The drain electrode 260 can be spaced away from the source electrode 250. For example, the drain electrode 260 can be disposed on the interlayer insulating layer 240. The drain electrode 260 can include a portion overlapping with the drain region 210D. For example, the gate insulating layer 220 and the interlayer insulating layer 240 can include a drain contact hole partially exposing the drain region 210D. The drain electrode 260 can be in direct contact with the drain region 210D in the drain contact hole. The drain electrode 260 can include a conductive material. For example, the drain electrode 260 can include a metal, such as aluminum (Al), chromium (Cr), molybdenum (Mo), tungsten (W) and copper (Cu). The drain electrode 260 can include a material different from the low-resistance electrode layer 232. The drain electrode 260 can include the same material as the source electrode 250.

A buffer layer 110 can be disposed between the device substrate 100 and the driving circuit D. The buffer layer 110 can prevent pollution from the device substrate 100 during a process of forming the driving circuit D. The buffer layer 110 can include an insulating material. For example, the buffer layer 110 can include silicon oxide (SiO) and/or silicon nitride (SiN). The buffer layer 110 can have a multi-layer structure. For example, the buffer layer 110 can have a structure in which an insulating layer formed of silicon oxide (SiO) and an insulating layer formed of silicon nitride (SiN) are stacked.

A lower passivation layer 120 can be disposed on the driving circuit D. The lower passivation layer 120 can prevent damage of the driving circuit D due to the external moisture and impact. For example, the lower passivation layer 120 can extend along a surface of the driving circuit D opposite to the device substrate 100. The lower passivation layer 120 can extend beyond the driving circuit D. For example, the source electrode 250 and the drain electrode 260 of the thin film transistor 200 can be covered by the lower passivation layer 120. The lower passivation layer 120 can include an insulating material. The lower passivation layer 120 can include an inorganic material. For example, the lower passivation layer 120 can include silicon oxide (SiO) or silicon nitride (SiN).

An over-coat layer 130 can be disposed on the lower passivation layer 120. The over-coat layer 130 can remove a thickness difference due to the driving circuit D. For example, a thickness difference due to the thin film transistor 200 can be removed by the over-coat layer 130. A surface of the over-coat layer 130 opposite to the device substrate 100 can be a flat surface. The over-coat layer 130 can extend along the lower passivation layer 120. The over-coat layer 130 can include an insulating material. The over-coat layer 130 can include a material having relatively high fluidity. For example, the over-coat layer 130 can include an organic material.

The light-emitting device 300 can be disposed on the over-coat layer 130. The light-emitting device 300 can emit light displaying a specific color. For example, the light-emitting device 300 can include a first electrode 310, a light-emitting layer 320 and a second electrode 330, which are sequentially stacked on the over-coat layer 130. The light-emitting device 300 can be electrically connected to the thin film transistor 200. For example, the first electrode 310 can be in direct contact with a portion of the drain electrode 260. The lower passivation layer 120 and the over-coat layer 130 can include an electrode contact hole partially exposing the drain electrode 260. The first electrode 310 can be connected to the drain electrode 260 in the electrode contact hole.

The first electrode 310 can include a conductive material. The first electrode 310 can include a material having relatively high reflectance. For example, the first electrode 310 can include a metal, such as aluminum (Al) and silver (Ag). The first electrode 310 can have a multi-layer structure. For example, the first electrode 310 can have a structure in which a reflective electrode formed of a metal is disposed between transparent electrodes formed of a transparent conductive material, such as ITO and IZO.

The light-emitting layer 320 can generate light having luminance corresponding to a voltage difference between the first electrode 310 and the second electrode 330. For example, the light-emitting layer 320 can be an emission material layer (EML) including an emission material. The emission material can include an organic material, an inorganic material or a hybrid material. For example, the display apparatus according to the embodiment of the present invention can be an organic light-emitting display apparatus including a light-emitting layer 320 formed of an organic material.

The second electrode 330 can include a conductive material. The second electrode 330 can include a material different from the first electrode 310. For example, the second electrode 330 can be a transparent electrode formed of a transparent conductive material, such as ITO and IZO. Thus, in the display apparatus according to the embodiment of the present invention, the light generated by the light-emitting layer 320 can be emitted outside through the second electrode 330.

The light-emitting device 300 can further include an emitting function layer between the first electrode 310 and the light-emitting layer 320, and/or between the light-emitting layer 320 and the second electrode 330. The emitting function layer can include at least one of a hole injection layer (HIL), a hole transporting layer (HTL), an electron transporting layer (ETL), and an electron injection layer (EIL). Thus, in the display apparatus according to the embodiment of the present invention, the emission efficiency of the light-emitting device 300 can be improved.

The encapsulating element 400 can be disposed on the driving circuit D and the light-emitting device 300. For example, the encapsulating element 400 can be disposed on the second electrode 330 of the light-emitting device 300. The encapsulating element 400 can prevent damage of the light-emitting device 300 due to the external moisture and impact. The encapsulating element 400 can extend beyond the second electrode 330. For example, the driving circuit D and the light-emitting device 300 can be covered by the encapsulating element 400.

The encapsulating element 400 can have a multi-layer structure. For example, the encapsulating element 400 can include a first encapsulating layer 410, a second encapsulating layer 420 and a third encapsulating layer 430, which are sequentially stacked on the second electrode 330. The first encapsulating layer 410, the second encapsulating layer 420 and the third encapsulating layer 430 can include an insulating material. The second encapsulating layer 420 can include a material different from the first encapsulating layer 410 and the third encapsulating layer 430. The encapsulating element 400 can have a structure in which an inorganic insulating layer and an organic insulating layer are stacked. For example, the first encapsulating layer 410 and the third encapsulating layer 430 can include an inorganic material, and the second encapsulating layer 420 can include an organic material. Thus, in the display apparatus according to the embodiment of the present invention, the damage of the light-emitting device 300 due to the external moisture and impact can be effectively prevented. A thickness difference due to the light-emitting device 300 can be removed by the second encapsulating layer 420. For example, a surface of the encapsulating element 400 opposite to the device substrate 100 can be parallel with a surface of the device substrate 100.

The display apparatus according to the embodiment of the present invention can include a plurality of the light-emitting devices 300. Each of the light-emitting devices 300 can be controlled independently from adjacent light-emitting device 300. For example, each of the light-emitting devices 300 can be connected to the driving circuit D different from adjacent light-emitting device 300. The first electrode 310 of each light-emitting device 300 can be insulated from the first electrode 310 of adjacent light-emitting device 300. For example, the first electrode 310 of each light-emitting device 300 can be spaced away from the first electrode 310 of adjacent light-emitting device 300. A bank insulating layer 140 can be disposed in a space between adjacent first electrodes 310. The bank insulating layer 140 can include an insulating material. For example, the bank insulating layer 140 can include an organic material. The bank insulating layer 140 can be in contact with the over-coat layer 130 between adjacent first electrodes 310. The bank insulating layer 140 can include a material different from the over-coat layer 130. The bank insulating layer 140 can cover an edge of each first electrode 310. For example, the light-emitting layer 320 and the second electrode 330 of each light-emitting device 300 can be stacked on a portion of the corresponding first electrode 310 exposed by the bank insulating layer 140.

Each of the light-emitting devices 300 can realize a color different from adjacent light-emitting device 300. For example, the light-emitting layer 320 of each light-emitting device 300 can include a material different from the light-emitting layer 320 of adjacent light-emitting device 300. The light-emitting layer 320 of each light-emitting device 300 can be spaced away from the light-emitting layer 320 of adjacent light-emitting device 300. For example, an end of the light-emitting layer 320 of each light-emitting device 300 can be disposed on the bank insulating layer 140.

The light-emitting layer 320 of each light-emitting device 300 can be formed by a deposition process using a fine metal mask (FMM). For example, a spacer 150 can be disposed on the bank insulating layer 140. The spacer 150 can prevent damage of adjacent light-emitting layer 320 and/or the bank insulating layer 140 due to the fine metal mask. Each of the light-emitting layers 320 can be spaced away from the spacer 150. For example, the end of each light-emitting layer 320 can be disposed on a surface of the bank insulating layer 140 which is disposed outside the spacer 150. The spacer 150 can include an insulating material.

A voltage applied to the second electrode 330 of each light-emitting device 300 can be the same as a voltage applied to the second electrode 330 of adjacent light-emitting device 300. For example, the second electrode 330 of each light-emitting device 300 can be electrically connected to the second electrode 330 of adjacent light-emitting device 300. The second electrode 330 of each light-emitting device 300 can include the same material as the second electrode 330 of adjacent light-emitting device 300. For example, the second electrode 330 of each light-emitting device 300 can be in contact with the second electrode 330 of adjacent light-emitting device 300. The bank insulating layer 140 and the spacer 150 can be covered by the second electrode 330.

A stacked structure of each light-emitting device 300 can have the same as a stacked structure of adjacent light-emitting device 300. For example, each of the light-emitting devices 300 can include the emitting function layer same as adjacent light-emitting device 300. The emitting function layer of each light-emitting device 300 can be connected to the emitting function layer of adjacent light-emitting device 300. For example, in the display apparatus according to the embodiment of the present invention, at least one of the hole injection layer (HIL), the hole transporting layer (HTL), the electron transporting layer (ETL), and the electron injection layer (EIL) can extend onto the bank insulating layer 140 and the spacer 150.

In the display apparatus according to the embodiment of the present invention, the gate electrode 230 overlapping with the channel region 210C of the oxide semiconductor pattern 210 can include the hydrogen barrier layer 231. Thus, in the display apparatus according to the embodiment of the present invention, hydrogen diffused from the encapsulating element 400 in a direction of the channel region 210C of the oxide semiconductor pattern 210 can be absorbed by the hydrogen barrier layer 231 of the gate electrode 230.

Figure 3:
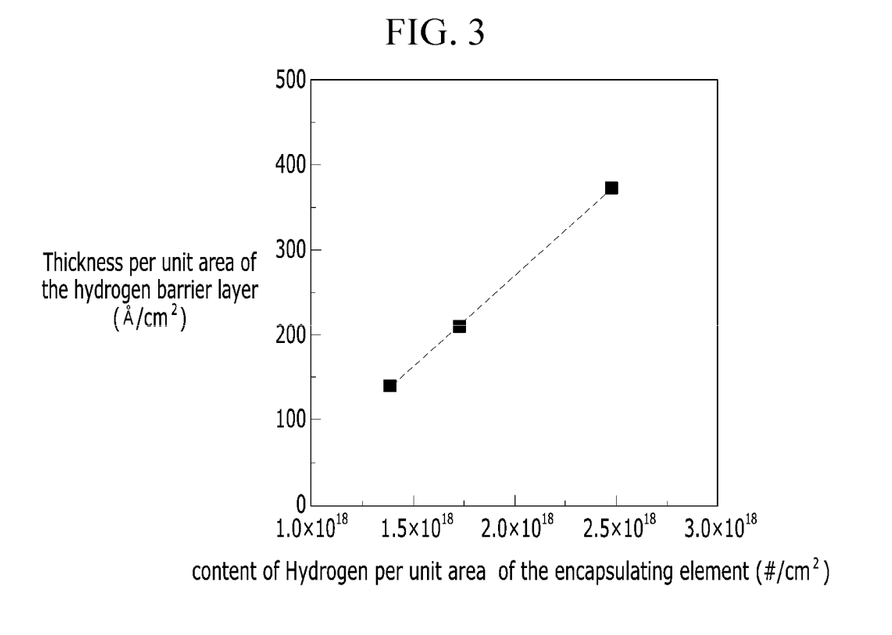
FIG. 3 is a graph showing the minimum thickness of a hydrogen barrier layer depending on a content of hydrogen per unit area of an encapsulating element to prevent the deterioration of an oxide semiconductor pattern in the display apparatus according to the embodiment(s) of the present invention.

FIG. 3 is a graph showing the minimum thickness of the hydrogen barrier layer 231 depending on a content of hydrogen per unit area of the encapsulating element 400 to prevent the deterioration of the oxide semiconductor pattern 210 in the display apparatus according to the embodiment of the present invention.

Referring to FIG. 3, the minimum thickness of the hydrogen barrier layer 231 to prevent the deterioration of the oxide semiconductor pattern 210 can be proportional to the content of hydrogen per unit area of the encapsulating element 400. More particular, when the hydrogen barrier layer 231 has a thickness satisfying the following equation (Equation 1 below), the deterioration of the oxide semiconductor pattern 210 due to hydrogen diffused from the encapsulating element 400 can be prevented. Thus, in the display apparatus according to the embodiment of the present invention, the thickness of the hydrogen barrier layer 231 overlapping with the channel region 210C of the oxide semiconductor pattern 210 can be determined by the following equation (Equation 1), so that the deterioration of the channel region 210C of the oxide semiconductor pattern 210 due to the encapsulating element 400 can be prevented.

$$y \geq 2.15 \times 10^{-16} x - 159.76 \qquad \text{[Equation 1]}$$

In the above equation, x is a content of hydrogen per unit area of the encapsulating element, y is the thickness of the first hydrogen barrier layer, and the thickness unit of the first hydrogen barrier layer is Å.

Accordingly, in the display apparatus according to the embodiment of the present invention, the thin film transistor 200 of the driving circuit D can include the oxide semiconductor pattern 210, and the hydrogen barrier layer 231 and the low-resistance electrode layer 232 which are sequentially stacked on the channel region 210C of the oxide semiconductor pattern 210, wherein the thickness of the hydrogen barrier layer 231 can be determined by the above equation (Equation 1). Thus, in the display apparatus according to the embodiment of the present invention, the deterioration of the channel region 210C of the oxide semiconductor pattern 210 due to hydrogen diffused from the encapsulating element 400 can be prevented. For example, in the display apparatus according to the embodiment of the present invention, it is possible to prevent a change in the threshold voltage of the thin film transistor 200 due to the encapsulating layer 400. Therefore, in the display apparatus according to the embodiment of the present invention, the reliability of the driving circuit D can be improved.

The display apparatus according to the embodiment of the present invention is described that the encapsulating element 400 has a stacked structure of an inorganic insulating layer and an organic insulating layer. In general, the hydrogen content of the inorganic insulating layer can be significantly higher than the hydrogen content of the organic insulating layer. Thus, in the display apparatus according to the embodiment of the present invention, the hydrogen barrier layer 231 of the gate electrode 230 can have a thickness proportional to a content of hydrogen per unit area of the inorganic insulating layer constituting the encapsulating element 400. For example, in the display apparatus according to the embodiment of the present invention, the thickness of the hydrogen barrier layer 231 can be proportional to a content of hydrogen per unit area of the first encapsulating layer 410 and the third encapsulating layer 430. Therefore, in the display apparatus according to the embodiment of the present invention, the characteristics deterioration of the thin film transistor 200 can be effectively prevented by using the hydrogen barrier layer 231, regardless of the configuration of the encapsulation element 400.

FIGS. 4A to 4G are graphs showing changes in a threshold voltage of the thin film transistor 200 over time, when the thickness of the hydrogen barrier layer 231 is 0 Å, 70 Å, 125 Å, 140 Å, 210 Å, 500 Å and 1000 Å, respectively, in the display apparatus according to the embodiment of the present invention.

Figure 4A:
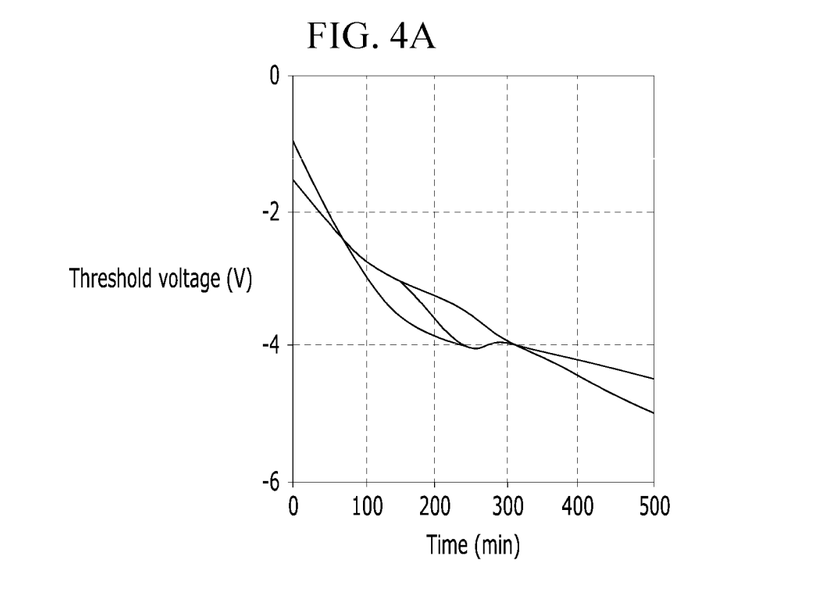
FIGS. 4A to 4G are graphs showing changes in a threshold voltage of the thin film transistor over time, when the thickness of the hydrogen barrier layer is 0 Å, 70 Å, 125 Å, 140 Å, 210 Å, 500 Å and 1000 Å, respectively, in the display apparatus according to the embodiment of the present invention.
Figure 4B:
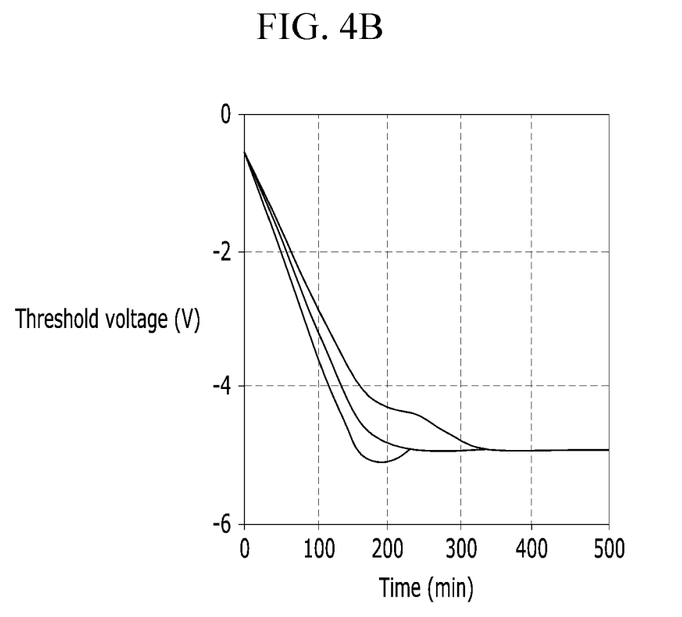
Figure 4C:
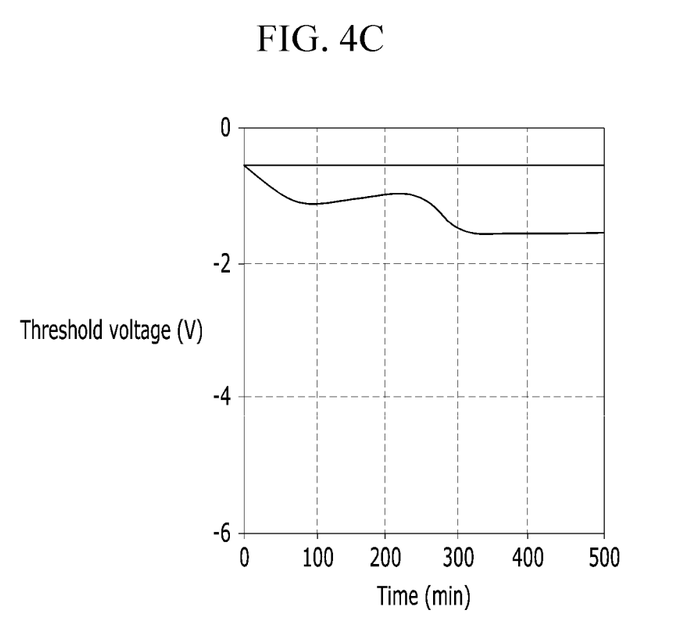
Figure 4D:
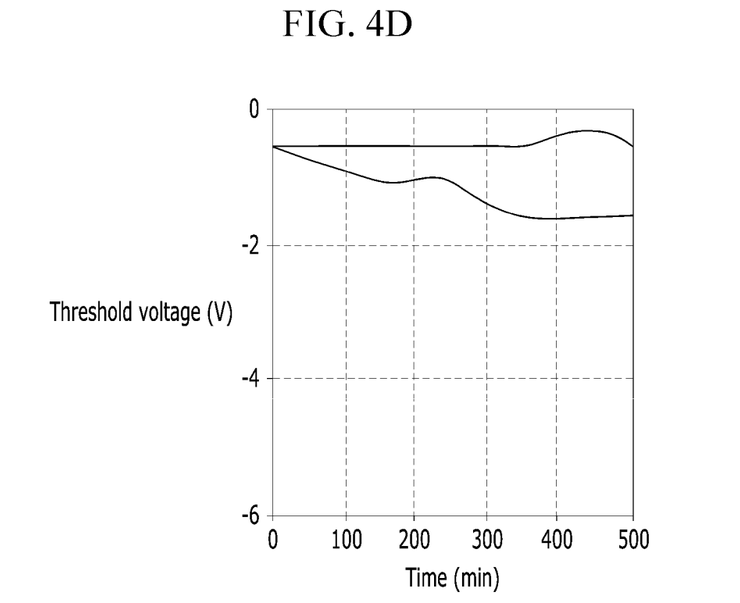
Figure 4E:
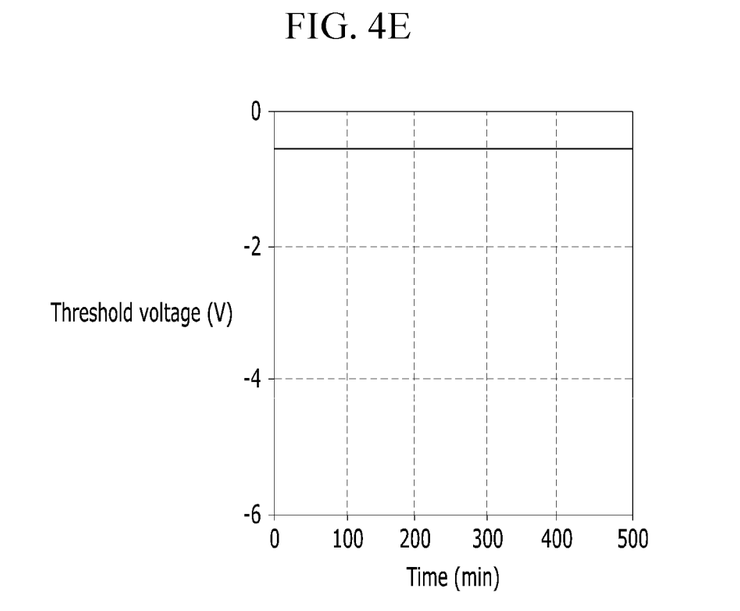
Figure 4F:
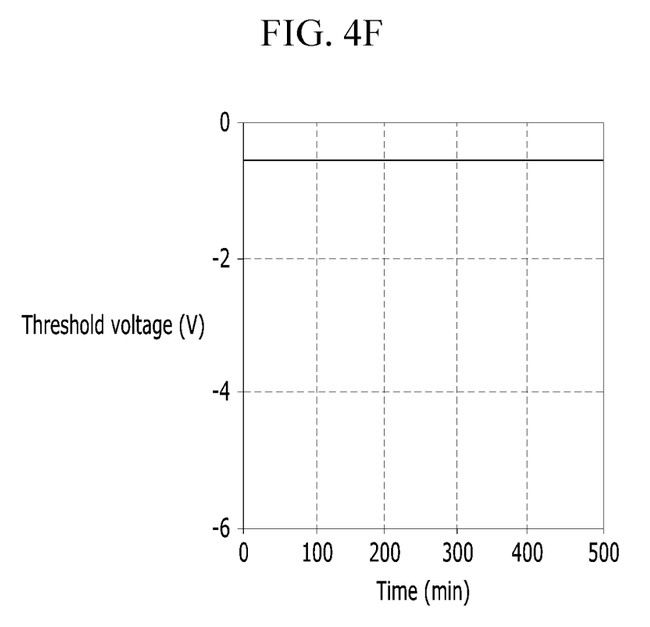
Figure 4G:
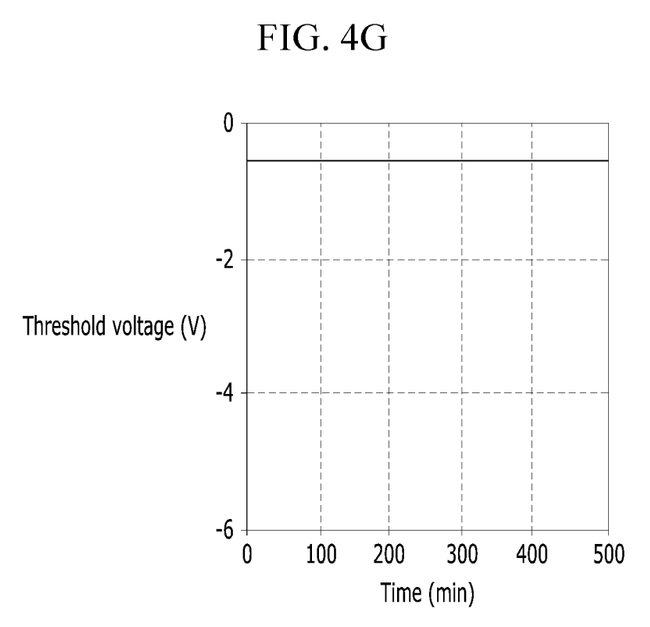

Referring to FIGS. 4A and 4B, when the thickness of the hydrogen barrier layer 231 is changed from OA to 70A, it can be seen that the threshold voltage of the thin film transistor 200 changes rapidly, as in the case where the hydrogen barrier layer 231 is not present. And, referring to FIGS. 4C to 4G, when the thickness of the hydrogen barrier layer 231 is 125 Å or more, it can be seen that the threshold voltage of the thin film transistor 200 does not change significantly with time. In particular, when the thickness of the hydrogen barrier layer 231 is 210 Å or more as shown in FIGS. 4E, 4F and 4G, it can be seen that the threshold voltage of the thin film transistor 200 does not change regardless of time. Thus, in the display apparatus according to the embodiment of the present invention, the hydrogen barrier layer 231 overlapping with the channel region 210C of the oxide semiconductor pattern 210 can have a thickness of 125 Å or more, preferably 210 Å or more, so that the characteristics deterioration of the thin film transistor 200 over time can be prevented.

Figure 5:
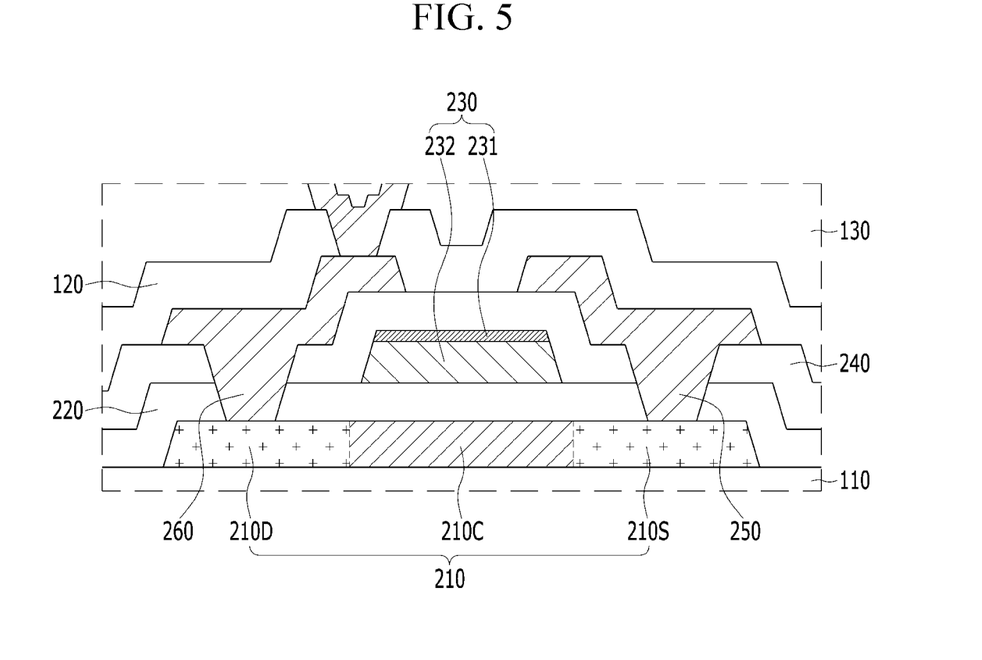
FIGS. 5 to 9 are views showing various examples of the display apparatus according to another embodiment of the present invention.

The display apparatus according to the embodiment of the present invention is described that the gate electrode 230 includes the hydrogen barrier layer 231 being in contact with the gate insulating layer 220. However, in the display apparatus according to another embodiment of the present invention, the gate electrode 230 can include the low-resistance electrode layer 232 and the hydrogen barrier layer 231, which are stacked on the gate insulating layer 220, as shown in FIG. 5. The low-resistance electrode layer 232 can be disposed between the gate insulating layer 220 and the hydrogen barrier layer 231. For example, the low-resistance electrode layer 232 can be in direct contact with the gate insulating layer 220 and the hydrogen barrier layer 231. Thus, in the display apparatus according to another embodiment of the present invention, the degree of freedom for the configuration and the forming process of the gate electrode 230 can be improved.

Figure 6:
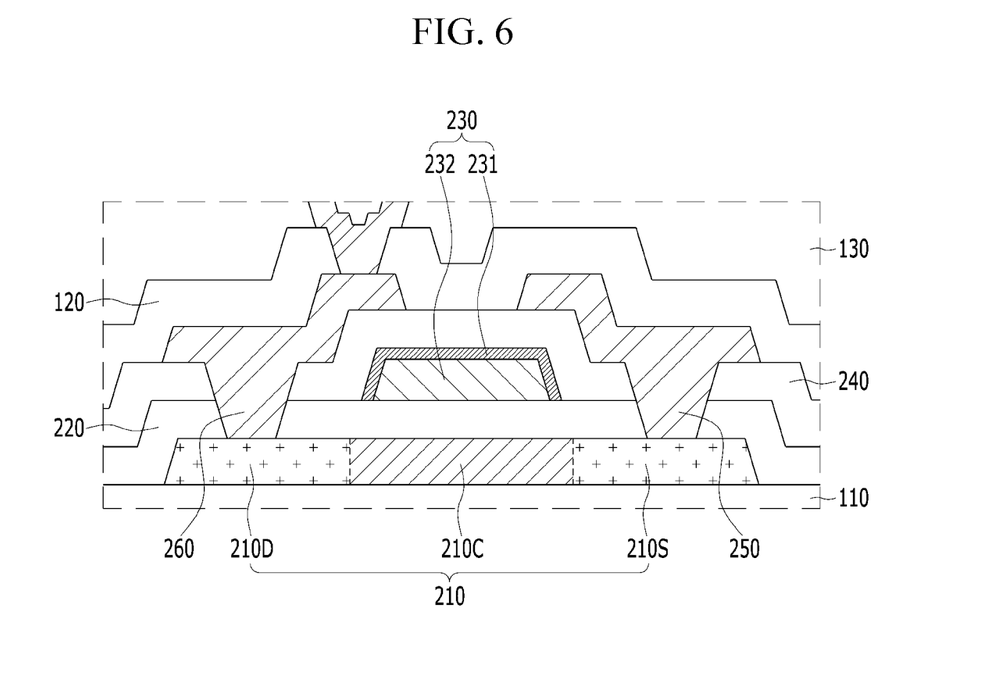

The display apparatus according to another embodiment of the present invention is described that the hydrogen barrier layer 231 covers only an upper surface of the low-resistance electrode layer 232 opposite to the device substrate 100. However, in the display apparatus according to still another embodiment of the present invention, the hydrogen barrier layer 231 can extend onto a side surface of the low-resistance electrode layer 232, as shown in FIG. 6. For example, the side surface of the low-resistance electrode layer 232 can be in direct contact with the hydrogen barrier layer 231. Thus, in the display apparatus according to still another embodiment of the present invention, the deterioration of the channel region 210C due to hydrogen diffused through the low-resistance electrode layer 232 can be prevented. For example, in the display apparatus according to still another embodiment of the present invention, the low-resistance electrode layer 232 does not serve as a path for diffusing the hydrogen. Therefore, in the display apparatus according to still another embodiment of the present invention, the characteristics deterioration of the thin film transistor 200 due to the hydrogen diffusion can be effectively prevented.

Figure 7:
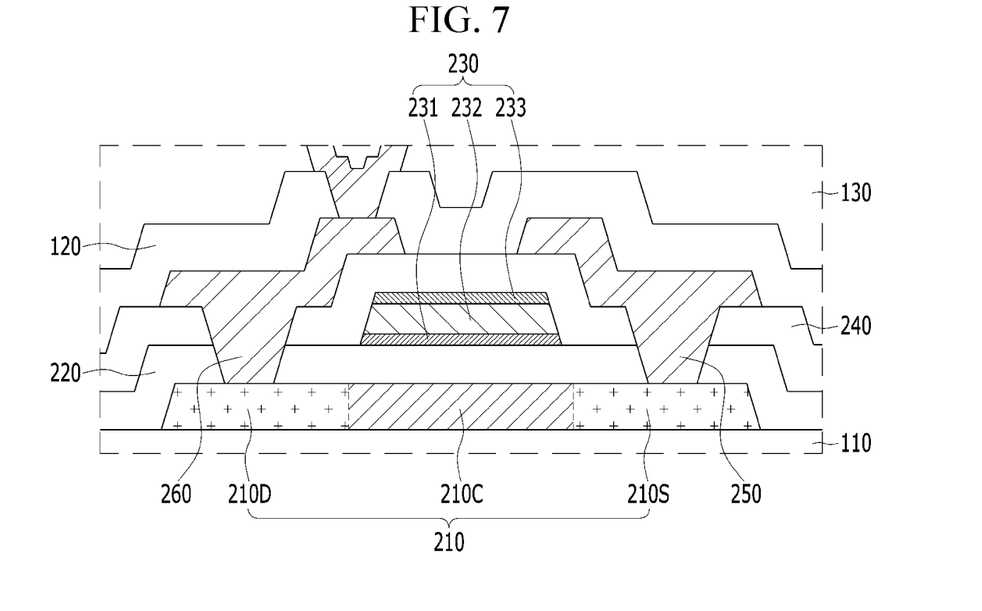

The display apparatus according to the embodiment of the present invention is described that the gate electrode 230 includes a single-layer of the hydrogen barrier layer 231. However, in the display apparatus according to another embodiment of the present invention, the gate electrode 230 can include a first hydrogen barrier layer 231, a low-resistance electrode layer 232 and a second hydrogen barrier layer 233, which are sequentially stacked on the channel region 210C of the oxide semiconductor pattern 210, as shown in FIG. 7. The first hydrogen barrier layer 231, the low-resistance electrode layer 232 and the second hydrogen barrier layer 233 can be simultaneously formed. For example, a side surface of the low-resistance electrode layer 232 can be continuously with a side surface of the first hydrogen barrier layer 231 and a side surface of the second hydrogen barrier layer 233. The second hydrogen barrier layer 233 can have a thickness different from the first hydrogen barrier layer 231. For example, the thickness of the first hydrogen barrier layer 231 can satisfy the above-mentioned equation (Equation 1), and the thickness of the second hydrogen barrier layer 233 can be smaller than the thickness of the first hydrogen barrier layer 231. The second hydrogen barrier layer 233 can include a material different from the first hydrogen barrier layer 231. Thus, in the display apparatus according to another embodiment of the present invention, the characteristics deterioration of the driving circuit due to the encapsulating element can be effectively prevented.

Figure 8:
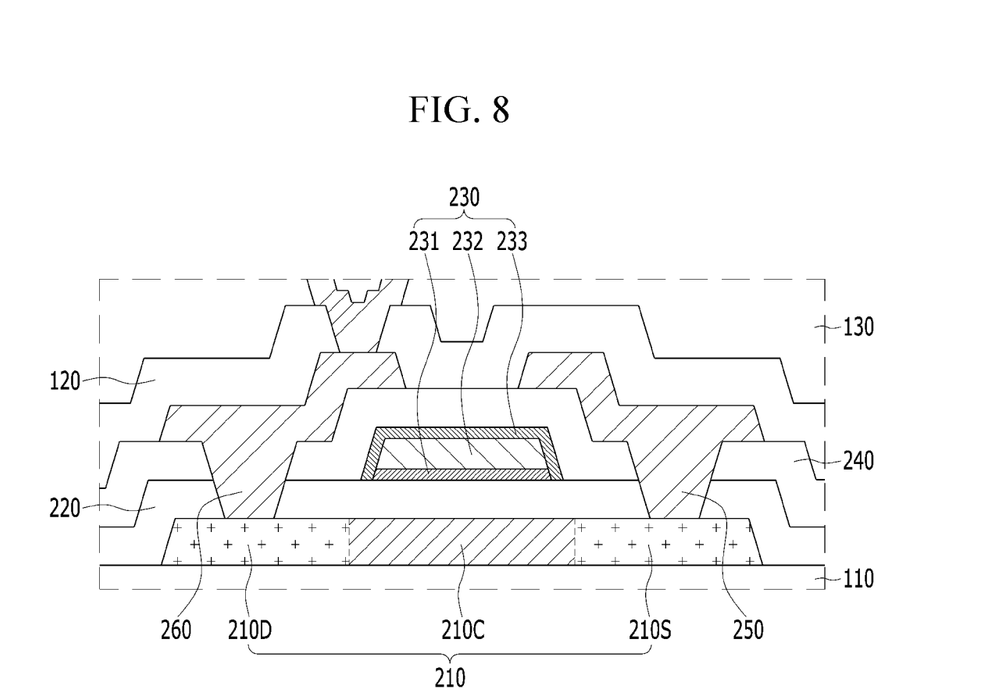

The display apparatus according to another embodiment of the present invention can include the low-resistance electrode layer 232 surrounded by the hydrogen barrier layer 231 and 233. For example, in the display apparatus according to another embodiment of the present invention, the first hydrogen barrier layer 231 can be disposed between the channel region 210C of the oxide semiconductor pattern 210 and the low-resistance electrode layer 232, the second hydrogen barrier layer 233 can be disposed on the low-resistance electrode layer 232, and the side surface of the low-resistance electrode layer 232 can be covered by the second hydrogen barrier layer 233, as shown in FIG. 8. The second hydrogen barrier layer 233 can extend onto the side surface of the first hydrogen barrier layer 231. For example, an end of the second hydrogen barrier layer 233 can be in direct contact with the gate insulating layer 220. Thus, in the display apparatus according to another embodiment of the present invention, the diffusion of the hydrogen through the low-resistance electrode layer 232 can be effectively prevented. Therefore, in the display apparatus according to another embodiment of the present invention, the deterioration of the channel region of the oxide semiconductor pattern due to the hydrogen diffusion can be prevented.

Figure 9:
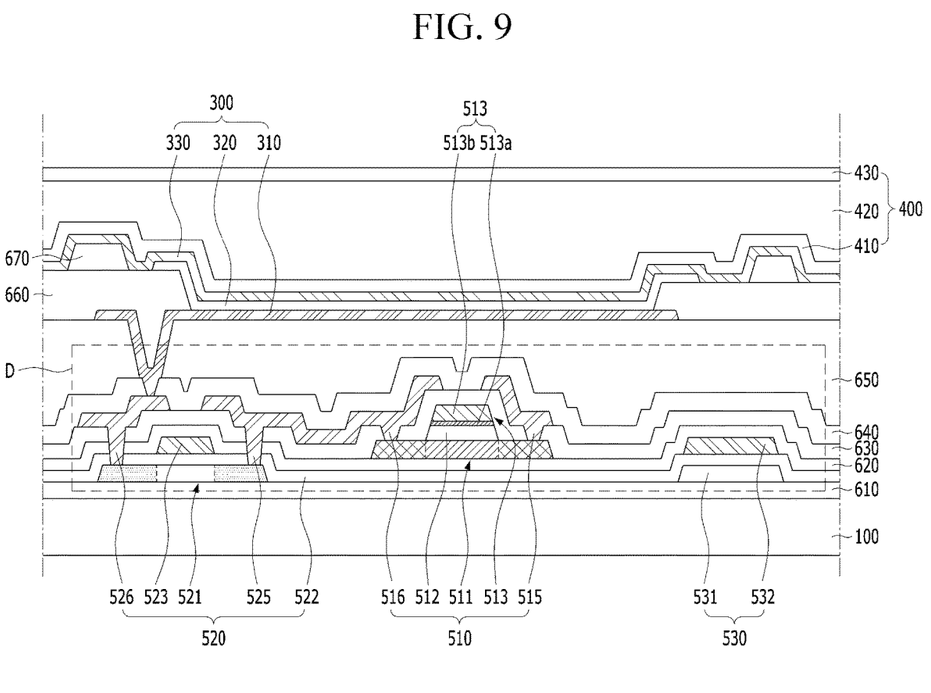

The display apparatus according to the embodiment of the present invention is described that the driving circuit D includes one thin film transistor 200. However, the display apparatus according to another embodiment of the present invention can include the driving circuit composed of a plurality of the thin film transistors. For example, in the display apparatus according to another embodiment of the present invention, the driving circuit D can include a first thin film transistor 510, a second thin film transistor 520 and a storage capacitor 530, as shown in FIG. 9. The first thin film transistor 510, the second thin film transistor 520 and the storage capacitor 530 can be disposed on the buffer layer 610.

The first thin film transistor 510 can include a first semiconductor pattern 511, a first gate insulating layer 512, a first gate electrode 513, a first source electrode 515 and a first drain electrode 516. The second thin film transistor 520 can include a second semiconductor pattern 521, a second gate insulating layer 522, a second gate electrode 523, a second source electrode 525 and a second drain electrode 526. The storage capacitor 530 can include a lower capacitor electrode 531 and an upper capacitor electrode 532.

The first semiconductor pattern 511 can be an oxide semiconductor having a metal oxide. The first gate insulating layer 512 can be disposed between the first semiconductor pattern 511 and the first gate electrode 513. The first gate insulating layer 512 can expose a source region and a drain region of the first semiconductor pattern 511. For example, a side surface of the first gate insulating layer 512 can be vertically aligned with a side surface of the first gate electrode 513. The first gate electrode 513 can have a structure in which a hydrogen barrier layer 513a and a low-resistance electrode layer 513b are stacked. The hydrogen barrier layer 513a can have a thickness satisfying the above-mentioned equation (Equation 1).

The second semiconductor pattern 521 can include a material different from the first semiconductor pattern 511. For example, the second semiconductor pattern 521 can include silicon. The first semiconductor pattern 511 can be disposed on a layer different from the second semiconductor pattern 521. For example, a first interlayer insulating layer 620 can be disposed on the second semiconductor pattern 521 and the second gate electrode 523, and the first semiconductor pattern 511 can be disposed on the first interlayer insulating layer 620. Thus, in the display apparatus according to another embodiment of the present invention, the first semiconductor pattern 511 which is an oxide semiconductor including a metal oxide may not be affected by a process of forming the second semiconductor pattern 521 including silicon.

Referring to FIG. 9, the first interlayer insulating layer 620 is illustrated as a single layer, but is not limited thereto. The first interlayer insulating layer 620 can have a multi-layer structure in which a layer formed of silicon nitride (SiN) and a layer formed of silicon oxide (SiO) are stacked. For example, the first interlayer insulating layer 620 can have a triple-layer structure in which a first layer formed silicon nitride (SiN), a second layer formed of silicon nitride (SiN) and a third layer formed of silicon oxide (SiO) are stacked.

The second gate insulating layer 522 can extend beyond the second semiconductor pattern 521. For example, the second gate insulating layer 522 can extend between the buffer layer 610 and the first interlayer insulating layer 620. The second gate insulating layer 522 can include a material different from the first gate insulating layer 512.

The first source electrode 515, the first drain electrode 516, the second source electrode 525 and the second drain electrode 526 can include the same material. The first source electrode 515, the first drain electrode 516, the second source electrode 525 and the second drain electrode 526 can be disposed on the same layer. For example, a second interlayer insulating layer 630 can be disposed on the first semiconductor pattern 511, the first gate electrode 513 and the first interlayer insulating layer 620, and the first source electrode 515, the first drain electrode 516, the second source electrode 525 and the second drain electrode 526 can be disposed on the second interlayer insulating layer 630.

Referring to FIG. 9, the second interlayer insulating layer 630 is illustrated as a single layer, but is not limited thereto. The second interlayer insulating layer 630 can have a multi-layer structure in which a layer formed of silicon nitride (SiN) and a layer formed of silicon oxide (SiO) are stacked. For example, the second interlayer insulating layer 630 can have a double-layer structure in which a layer formed silicon nitride (SiN) and a layer formed of silicon oxide (SiO) are stacked. The first drain electrode 516 can be spaced away from the first source electrode 515. The second drain electrode 526 can be spaced away from the second source electrode 525. The second source electrode 525 can be connected to the first drain electrode 516. Thus, in the display apparatus according to another embodiment of the present invention, a driving current by the first thin film transistor 510 and the second thin film transistor 520 can be provided to the light-emitting device 300.

The storage capacitor 530 can be formed by a process of forming the first thin film transistor 510 and/or the second thin film transistor 520. For example, the first capacitor electrode 531 can include the same material as the second semiconductor pattern 521. The first capacitor electrode 531 can be disposed on the same layer as the second semiconductor pattern 521. For example, the first capacitor electrode 531 can be disposed between the buffer layer 610 and the first interlayer insulating layer 620. The second capacitor electrode 532 can include the same material as the second gate electrode 523. The second capacitor electrode 532 can be disposed on the same layer as the second gate electrode 523. For example, the second capacitor electrode 532 can be disposed on the second gate insulating layer 522. The second capacitor electrode 532 can include a portion overlapping with the first capacitor electrode 531.

A lower passivation layer 640 and an over-coat layer 650 can be disposed on the driving circuit D. The light-emitting device 300 can be disposed on the over-coat layer 650. The encapsulating element 400 can be disposed on the light-emitting device 300.

Referring to FIG. 9, the lower passivation layer 640 can be formed of an inorganic insulating layer or an organic insulating layer. When the lower passivation layer 640 is an inorganic insulating layer, the lower passivation layer 640 can be formed of at least one of silicon nitride (SiN) and silicon oxide (SiO). When the lower passivation layer 640 is an organic insulating layer, the lower passivation layer 640 can include at least one of acryl resin, epoxy resin, phenolic resin, polyamide resin and polyimide resin.

And, when the lower passivation layer 640 is an organic insulating layer, an auxiliary electrode can be disposed between the lower passivation layer 640 and the over-coat layer 650. The auxiliary electrode can serve to electrically connect the second drain electrode 526 of the second thin film transistor 520 to the first electrode 310 of the light-emitting device 300.

The over-coat layer 650 can include an organic material, such as acryl resin, epoxy resin, phenolic resin, polyamide resin and polyimide resin.

Accordingly, in the display apparatus according to another embodiment of the present invention, the driving circuit D can include the thin film transistors 510 and 520, at least one of the thin film transistors 510 and 520 can include a semiconductor pattern 511 and 512 which is an oxide semiconductor including a metal oxide, the gate electrode 513 overlapping with the channel region of the semiconductor pattern 511 which is an oxide semiconductor can include the hydrogen barrier layer 513a, and the thickness of the hydrogen barrier layer 513a can satisfy the equation (Equation 1). Thus, in the display apparatus according to another embodiment of the present invention, the degree of freedom for the configuration of the driving circuit D and the reliability of the driving circuit D can be improved.

As a result, the display apparatus according to the embodiments of the present invention can include the thin film transistor including an oxide semiconductor pattern, and an encapsulating element on the thin film transistor, wherein the gate electrode of the thin film transistor can include the hydrogen barrier layer and the low-resistance electrode layer, which are stacked on the channel region of the oxide semiconductor pattern. The thickness of the hydrogen barrier layer can be determined by the content of hydrogen per unit area of the encapsulating element. Thus, in the display apparatus according to the embodiments of the present invention, the characteristics deterioration of the thin film transistor due to hydrogen diffused from the encapsulating element can be prevented. Therefore, in the display apparatus according to the embodiments of the present invention, the reliability of the driving circuit can be improved effectively.

What is claimed is:

1. A display apparatus comprising:
a driving circuit on a device substrate, the driving circuit including a thin film transistor;
a light-emitting device on the device substrate, the light-emitting device electrically connected to the driving circuit; and
an encapsulating element on the driving circuit and the light-emitting device,
wherein the thin film transistor includes an oxide semiconductor pattern, a gate insulating layer covering the oxide semiconductor pattern, a buffer layer between the device substrate and the oxide semiconductor pattern, and a gate electrode on the gate insulating layer,
wherein the gate electrode overlapping with a channel region of the oxide semiconductor pattern has a structure in which a first hydrogen barrier layer including a conductive material and a low-resistance electrode layer are stacked, and
wherein a thickness of the first hydrogen barrier layer is determined by a following equation:

$$y \geq 2.15 \times 10^{-16} x - 159.76 \quad \text{[equation]}$$

wherein, x is a content of hydrogen per unit area of the encapsulating element, y is the thickness of the first hydrogen barrier layer, and a thickness unit of the first hydrogen barrier layer is Å.

2. The display apparatus according to claim 1, wherein the first hydrogen barrier layer includes titanium (Ti).

3. The display apparatus according to claim 1, wherein the first hydrogen barrier layer is disposed between the oxide semiconductor pattern and the low-resistance electrode layer.

4. The display apparatus according to claim 3, wherein the first hydrogen barrier layer is in contact with the gate insulating layer.

5. The display apparatus according to claim 3, wherein the gate electrode includes a second hydrogen barrier layer on the low-resistance electrode layer.

6. The display apparatus according to claim 5, wherein a thickness of the second hydrogen barrier layer is different from the thickness of the first hydrogen barrier layer.

7. The display apparatus according to claim 5, wherein the second hydrogen barrier layer includes a material different from the first hydrogen barrier layer.

8. The display apparatus according to claim 1, wherein the low-resistance electrode layer includes a material having a lower resistance than the first hydrogen barrier layer.

9. A display apparatus comprising:
an oxide semiconductor pattern on a device substrate, the oxide semiconductor pattern including a channel region between a source region and a drain region;
a gate electrode on the channel region of the oxide semiconductor pattern, the gate electrode having a structure in which a first hydrogen barrier layer and a low-resistance electrode layer are stacked;
a gate insulating layer between the oxide semiconductor pattern and the gate electrode, the gate insulating layer extending outside the oxide semiconductor pattern;
a source electrode on the device substrate, the source electrode electrically connected to the source region of the oxide semiconductor pattern;
a drain electrode on the device substrate, the drain electrode electrically connected to the drain region of the oxide semiconductor pattern; and
an encapsulating element covering the oxide semiconductor pattern, the gate electrode, the gate insulating layer, the source electrode and the drain electrode,
wherein the first hydrogen barrier layer and the low-resistance electrode layer of the gate electrode are separated from the oxide semiconductor pattern by the gate insulating layer, and
wherein a thickness of the first hydrogen barrier layer and a content of hydrogen per unit area of the encapsulating element satisfy a following equation:

$$y \geq 2.15 \times 10^{-16} x - 159.76 \quad \text{[equation]}$$

wherein, x is a content of hydrogen per unit area of the encapsulating element, y is the thickness of the first hydrogen barrier layer, and a thickness unit of the first hydrogen barrier layer is Å.

10. The display apparatus according to claim 9, wherein the thickness of the first hydrogen barrier layer is approximately 125 Å or more.

11. The display apparatus according to claim 9, wherein the low-resistance electrode layer is disposed between the gate insulating layer and the first hydrogen barrier layer.

12. The display apparatus according to claim 11, wherein the first hydrogen barrier layer extends onto a side surface of the low-resistance electrode layer.

13. The display apparatus according to claim 12, wherein the gate electrode further includes a second hydrogen barrier layer between the gate insulating layer and the low-resistance electrode layer.

14. The display apparatus according to claim 13, wherein the first hydrogen barrier layer extends onto a side surface of the second hydrogen barrier layer.

15. The display apparatus according to claim 9, wherein the first hydrogen barrier layer is disposed between the gate insulating layer and the low-resistance electrode layer.

16. The display apparatus according to claim 9, wherein the first hydrogen barrier layer includes titanium (Ti).

17. The display apparatus according to claim 9, wherein the encapsulating element has a structure in which an inorganic insulating layer and an organic insulating layer are stacked, and
wherein the thickness of the first hydrogen barrier layer is proportional to a content of hydrogen per unit area of the inorganic insulating layer.

* * * * *